United States Patent
Ashby et al.

(10) Patent No.: US 7,403,761 B2
(45) Date of Patent: Jul. 22, 2008

(54) SYSTEM AND METHOD FOR FREQUENCY TRANSLATION USING AN IMAGE REJECT MIXER

(75) Inventors: Kirk B. Ashby, McKinney, TX (US);
Albert H. Taddiken, Garland, TX (US);
S. Vincent Birleson, West Tawakoni, TX (US)

(73) Assignee: Microtune (Texas), L.P., Plano, TX (US)

(*) Notice: Subject to any disclaimer, the term of this patent is extended or adjusted under 35 U.S.C. 154(b) by 0 days.

(21) Appl. No.: 11/523,785

(22) Filed: Sep. 19, 2006

(65) Prior Publication Data

US 2007/0066267 A1    Mar. 22, 2007

Related U.S. Application Data

(63) Continuation of application No. 09/552,760, filed on Apr. 18, 2000, now Pat. No. 7,184,724.

(51) Int. Cl.
*H04B 1/68* (2006.01)
*H04B 1/26* (2006.01)

(52) U.S. Cl. .................. 455/314; 455/189.1; 455/203; 348/654; 342/13

(58) Field of Classification Search .......... 455/203, 455/130, 75, 228.1, 226.4, 67.4, 189.1, 190.1, 455/333, 108–109, 112, 118–120, 150.1, 455/179.1, 180.1–180.3, 182.1–182.3, 183.1, 455/188.1–188.2, 192.1–192.3, 205–207, 455/293, 295–296, 302–307, 311, 313–314, 455/323, 334; 375/224, 376; 325/607, 615; 348/654, 725, 726, 731; 342/13, 21; 329/318–321, 329/327, 336
See application file for complete search history.

(56) References Cited

U.S. PATENT DOCUMENTS 4,581,643 A    4/1986    Carlson (Continued)

FOREIGN PATENT DOCUMENTS

DE    19731012 A    7/1997

(Continued)

OTHER PUBLICATIONS

Okanobu, Taiwa, Hitoshi Tomiyama, and Hiroshi Arimoto. "Advanced Low Voltage Single Chip Radio IC." IEEE Transactions on Consumer Electronics. vol. 38 No. 3. (Aug. 1992) 465-475.

(Continued)

*Primary Examiner*—Pablo N Tran
(74) *Attorney, Agent, or Firm*—Fulbright & Jaworski LLP

(57) ABSTRACT

Frequency translation, such as frequency up conversion of a video baseband or intermediate frequency to a desired frequency division broadcast channel, is provided utilizing a single sideband or image reject mixer and filtering having relaxed selectivity requirements. According to a preferred embodiment, a first single sideband mixer accepts an input signal at an intermediate frequency and up converts this signal to a high intermediate frequency. The image rejection provided by the single sideband mixer in combination with simple filtering provide sufficient signal quality to achieve desired levels of desired signal isolation, such as on the order of 40 dB. Preferably, a second single sideband mixer accepts the high intermediate frequency signal and down converts this signal to a desired transmission or broadcast frequency. The image rejection provided by the single sideband mixers in combination with simple filtering provide sufficient desired signal isolation, such as on the order of 40 dB, thereby relax the linearity requirements of amplifiers utilized in the frequency translation system. A preferred embodiment of the present invention disposes all or substantially all the frequency translation circuit elements on a single substrate.

26 Claims, 1 Drawing Sheet

U.S. PATENT DOCUMENTS

| | | | |
|---|---|---|---|
| 4,696,055 | A | 9/1987 | Marshall |
| 4,726,072 | A | 2/1988 | Yamashita et al. |
| 4,742,566 | A | 5/1988 | Nordholt et al. |
| 4,979,230 | A | 12/1990 | Marz |
| 5,038,404 | A | 8/1991 | Marz |
| 5,060,297 | A | 10/1991 | Ma et al. |
| 5,140,198 | A | 8/1992 | Atherly et al. |
| 5,200,826 | A | 4/1993 | Seong |
| 5,214,796 | A | 5/1993 | Gorrie et al. |
| 5,243,304 | A | 9/1993 | Rixon |
| 5,311,318 | A | 5/1994 | Dobrovolny |
| 5,321,852 | A | 6/1994 | Seong |
| 5,339,462 | A | 8/1994 | Staudinger et al. |
| 5,343,168 | A | 8/1994 | Guthrie |
| 5,355,524 | A | 10/1994 | Higgins, Jr. |
| 5,383,223 | A | 1/1995 | Inokuchi |
| 5,390,346 | A | 2/1995 | Marz |
| 5,410,743 | A | 4/1995 | Seely et al. |
| 5,528,196 | A | 6/1996 | Baskin et al. |
| 5,559,468 | A | 9/1996 | Gailus |
| 5,563,545 | A | 10/1996 | Scheinberg |
| 5,661,485 | A | 8/1997 | Manuel |
| 5,705,959 | A * | 1/1998 | O'Loughlin ............... 332/151 |
| 5,706,311 | A | 1/1998 | Koyama |
| 5,737,035 | A | 4/1998 | Rotzoll |
| 5,861,781 | A | 1/1999 | Ashby |
| 5,937,006 | A | 8/1999 | Clark et al. |
| 5,950,119 | A | 9/1999 | McGeehan et al. |
| 6,031,878 | A | 2/2000 | Tomasz et al. |
| 6,064,694 | A * | 5/2000 | Clark et al. ............... 375/224 |
| 6,112,069 | A | 8/2000 | Na |
| 6,115,586 | A | 9/2000 | Bezzam et al. |
| 6,118,811 | A * | 9/2000 | Narumi et al. ............. 375/219 |
| 6,137,995 | A * | 10/2000 | Durec et al. ............... 455/75 |
| 6,144,845 | A | 11/2000 | Durec |
| 6,177,964 | B1 | 1/2001 | Birleson et al. |
| 6,195,539 | B1 | 2/2001 | Galal et al. |
| 6,285,865 | B1 | 9/2001 | Vorenkamp et al. |
| 6,339,621 | B1 | 1/2002 | Cojocaru et al. |
| 6,400,416 | B1 | 6/2002 | Tomasz |
| 6,493,410 | B1 | 12/2002 | Shalom et al. |
| 6,496,545 | B1 | 12/2002 | Liu |
| 6,516,187 | B1 | 2/2003 | Williams et al. |
| 6,522,642 | B1 * | 2/2003 | Scott ........................ 370/342 |
| 6,675,024 | B1 | 1/2004 | Loke et al. |
| 6,982,592 | B2 * | 1/2006 | Petrovic et al. ............ 329/323 |
| 7,058,379 | B2 * | 6/2006 | Draijer ...................... 455/258 |
| 7,209,721 | B2 * | 4/2007 | Kim et al. .................. 455/203 |

FOREIGN PATENT DOCUMENTS

| | | |
|---|---|---|
| EP | 0508741 A2 | 10/1992 |
| EP | 684697 A | 11/1995 |
| EP | 0706259 A1 | 4/1996 |
| EP | 0858156 A1 | 8/1998 |
| EP | 0948129 A1 | 10/1999 |

OTHER PUBLICATIONS

Anadigics, Inc. CATV/TV/Cable Modem Upconverter MMIC. Warren NJ (Apr. 22, 1998).

Anadigics, Inc. Anagics Technical Brief. Upconverter MMIC for CATV Preliminary. Warren, NJ. (Jan. 11, 1994).

Archer, John, and John Granlund, and Robert E. Mauzy. "A Broad-Band UHF Mixer Exhibiting High Image Rejection over a Multidecade Baseband Frequency Range." IEEE Journal of Solid-State Circuits, vol. SC-16 No. 4 (Aug. 1981) 385-392.

"Double-balanced mixer and oscillator" Phillips Semiconductors. (Nov. 7, 1997). 1-11.

Gilbert, Barrie. "Demystifying the Mixer" Analog Devices Inc. (Apr. 1994). 1-58.

Scheinberg, N., et al. "A GaAs Up Converter Interated Circuit for a Double Conversion Cable TV "Set-Top" Tuner" International Conference on Consumer Electronics. (Jun. 1993). 108-109.

Maier, G.M., et al. "Double Conversion Tuner a Must for the Future?" IEEE Transaction on Consumer Electronics, vol. 38, No. 3. (Aug. 1992). 384-388.

Gilbert, Barrie and Baines, Rupert. "Fundamentals of Active Mixers" Applied Microwave and Wireless. (1995). 10-27.

Muller, J-E., et al. "A Double-Conversion Broad Band TV Tuner with GaAs ICs." GaAs IC Symposium Technical Digest. (1984). 97-98.

Nakatsuka, T., et al. , "Low Distortion and Low Noise Oscillator Mixer for CATV Converters." GaAs Symposium Technical Digest. (1988). 161-164.

Brady, Vernon, et al. "Development of a Monolithic FET Ka-Band Single Side Band UFConverter and Image Reject Downconverter." GaAs Symposium Technical Digest (Oct. 1989) 189-192.

Ablassmeier, Ulrich, et al. "GaAs FET Upconverter for TV Tuner" IEEE Transactions on Electron Devides, vol. ED-27, No. 6. (Jun. 1980). 1156-1159.

Maas, Stephen A. "A GaAs MESFET Mixer with Very Low Intermodulation" IEEE Transactions on Microwave Theory and Techniques, vol. MTT-35, No. 4. (Apr. 1987). 425-429.

Pandula, Louis. "Image Reject and Image Canceling Mixers" RF Design. (Apr. 1995). 60-65.

Svelto, F., et al. "A Low-Voltage Topology After CMOS RF Mixers." IEEE Transactions on Consumer Electronics., vol. 45, No. 2 (May 1999). 299-309.

Gilbert, Barrie. "The Micromixer: A highly Linear Variant of the Gilbert Mixer using a Bisymmetric Class-AB Input Stage" IEEE Journal of Solid-State Circuits, vol. 32, No. 9, (Sep. 1997). 1412-1423.

Ducourant, Thierry, et al. "A 3 Chip GaAs Double Conversion TV Tuner System with 70 db Image Rejection." Monolithic Circuits Symposium Digest of Papers. (1988). 87-90.

MC13143: Ultra Low Power DC-2.4 GHz Linear Mixer. Motorola, Inc. Issue 2. (1996). 1-8.

McDonald, Mark D. "A 2.5GHz BiCMOS Image-Reject Front-End" IEEE International Solid-State Circuits Conference. (1993). 144-145.

Farmer, James O. "Specifications for Tuner Design for use in Cable Ready Television Receivers and VCRs." IEEE Transactions on Consumer Electronics, vol. 36, No. 3,. (Aug. 1990). 660-668.

Abidi, Asad A. "Direct-Conversion Radio Transceivers for Digital Communications." IEEE International Solid-State Circuits Conference. (1995). 186-187; 363-364.

Crols, Jan and Michiel Steyaert. "A Fully integrated 900MHz CMOS Double Quadrature Downconverter" IEEE International Solid-State Circuits Conference. (1995). 136-137.

Sabin, William E. & Edgar O. Schoenike. "Single -Sideband Systems & Circuits." McGraw Hill Book Company. New York. (1987). 88-134, 181-213.

* cited by examiner

SYSTEM AND METHOD FOR FREQUENCY TRANSLATION USING AN IMAGE REJECT MIXER

CROSS-REFERENCE TO RELATED APPLICATIONS

The present application is a continuation of commonly assigned, patent application Ser. No. 09/552,760 entitled "SYSTEM AND METHOD FOR FREQUENCY TRANSLATION USING AN IMAGE REJECT MIXER," filed Apr. 18, 2000 now U.S. Pat. No. 7,184,724, the disclosure of which is hereby incorporated herein by reference.

TECHNICAL FIELD

The present invention relates generally to the transmission of modulated signals and more particularly to the translation of a signal from one carrier frequency to another carrier frequency.

BACKGROUND OF THE INVENTION

The translation of modulated signals between different carrier frequencies is common in signal transmission. For example, upconverters are used in the television industry to translate information that is present at a particular low intermediate frequency (LIF) to a higher frequency for final transmission. Specifically, it is common in the United States to convert a signal at a LIF of 44 MHZ to a frequency division multiplex (FDM) final transmission frequency in the range of 53 MHZ to 857 MHZ. Similarly, European television transmission often utilizes up conversion of a signal at a LIF of 36.125 MHZ to a FDM final transmission frequency which may vary from a few tens of MHZ to nearly 1 GHz.

However, due to the relatively close packing of the FDM frequency bands associated with the various transmission channels, upconverters used as described above in the television industry are required to have a spectrally pure output so that information is transmitted in the desired FDM channel, without producing interfering signals in other FDM channels. Meeting the specifications generally required in the television industry is often very difficult due to the relatively close channelization scheme, the typically broad range of spectrum translated between, the relatively high transmission power requirements, the typically large amount of information modulated in the signal, and the like. For example, although often not providing the final transmission signal, upconverters are often deployed in the system such that their output signal must have enough output power to pass through a number of passive splitters and combiners that are disposed in the signal path. Upconverters used in these applications are not only required to translate a signal from one frequency to another within tight tolerances, but must also amplify the signal to a specified relatively high level.

Accordingly, the television industry presently uses upconverters that are designed using mostly discrete components, i.e., transistors, inductors, capacitors, resisters, deployed on printed circuit boards to provide discrete mixers, such as may be relatively easily relied upon to accommodate the relatively high transmission powers, provide the sharp cutoff filters needed to remove unacceptable spurious signals, and operate throughout the desired frequency spread. However, the use of such components tends to result in an upconverter product which is large, expensive, and which consumes large amounts of power. For example, a typical state of the art upconverter providing head end quality for use in television transmission applications requires a 19 inch rack mount form factor. Such a size requirement significantly limits the situations in which the upconverter may be deployed. Moreover, the use of such discrete components generally results in relatively high power requirements, further limiting deployment opportunities.

Additional circuit limitations associated with the use of such discrete components further encumber the design and operation of prior art devices. For example, it is often very difficult and/or expensive to achieve good matching of components when utilizing discrete components. However, matching of components in order to implement particular circuit designs is often critical, e.g., as little as 1° of mismatch in certain circuit configurations introduce spurious signals that generally cannot be tolerated in the aforementioned television transmission applications. Accordingly, particular circuit designs are often precluded from use due to the difficulty and/or expense associated with suitably matching components to implement a circuit design.

Accordingly, a need exists in the art for a frequency translation function to be provided in a reduced form factor to reduce size, expense, and/or power consumption. A further need exists in the art to provide such frequency translation function in an integrated circuit or circuits to achieve the aforementioned reduced size, expense, and/or power consumption as well as to facilitate component matching and, therefore, broaden the circuit designs available for use in providing frequency translation functions.

BRIEF SUMMARY OF THE INVENTION

These and other objects, features and technical advantages are achieved by a system and method which utilizes an integrated circuit utilizing low cost filters to provide frequency translation in a low cost solution that occupies little space and consumes little power. A preferred embodiment upconverter architecture according to the present invention utilizes matching characteristics achievable in an integrated circuit design to implement image reject or single sideband mixers that relax the filter requirements of the circuit, such as the filter requirements of a high intermediate frequency (HIF), while providing frequency translation within the desired tolerances. Additionally, the preferred embodiment utilizes single sideband mixing to reduce the linearity requirements of components, such as amplifiers used in the frequency translation circuit.

A preferred embodiment of the present invention utilizes an integrated circuit design providing very close matching of particular circuit components in order to provide at least one single sideband mixer. Preferably this single sideband mixer utilizes a phase splitter providing in-phase (I) and quadrature (Q) components of a local oscillator (LO) frequency used in up conversion of a signal. Accordingly, a single substrate may be utilized according to the present invention to provide a fully integrated frequency translation circuit.

A most preferred embodiment of the present invention utilizes multiple stages of single sideband mixers in frequency translation. For example, a preferred embodiment utilizes a first single sideband mixer, preferably utilizing a corresponding first phase splitter, to translate a baseband or intermediate frequency (IF) input signal to a first IF. The first IF signal may be filtered and/or amplified, or otherwise manipulated as desired, before passing to a second single sideband mixer, preferably utilizing a corresponding second phase splitter, to translate the first IF to a second IF. Again the output of the second single sideband mixer stage may be filtered and/or amplified, or otherwise manipulated as desired, before being passed as an output signal.

According to a preferred embodiment of the present invention, the above described multiple stages of mixing utilized in frequency translation provide both frequency up conversion and down conversion. For example, a most preferred embodiment utilizes the above described first mixing stage to up convert a baseband or IF signal to a high intermediate frequency (HIF) and the second mixing stage to down convert the HIF to a desired second IF which is at a lower frequency than the HIF. The use of up conversion and down conversion in frequency translation according to the present invention is preferred in order to simplify filtering of signals and, thereby, synergize the integrated configuration of the preferred embodiment upconverter.

It should be appreciated that because the preferred embodiment of the present invention utilizes single sideband mixing, images and other spurious signals associated with the input signal and/or first IF signal are eliminated or greatly reduced, such as on the order of −35 to −40 dB, and therefore the filtering requirements of the circuit are relaxed. Accordingly, a preferred embodiment of the present invention utilizes filter elements, such as bandpass, lowpass, and/or highpass filters, which are provided on a same single substrate as the preferred embodiment single sideband mixer. Although such integrated circuit filter elements typically do not provide as well defined cutoff points or as sharp of frequency rejection as is available with discrete filter elements, the preferred embodiment of the present invention may be relied upon to provide frequency translation to within tolerances associated with television transmission head end quality signals through the use of matched components and single sideband mixing. Of course, filter elements external to the preferred embodiment single substrate, such as discrete filter elements, may be utilized if desired.

Additionally, high output signal quality is achievable according to the present invention utilizing active components, such as amplifiers, having relaxed linearity requirements. Utilizing the single sideband mixers of the preferred embodiment greatly reduces the signal images and other spurious signals which often cause a circuit design to implement highly linear active components in order to avoid subsequent distortion of the signals. However, the design of a preferred embodiment of the present invention relies upon active components which are linear over a smaller range of frequencies and signal levels due to the elimination and/or reduction of spurious signals. Accordingly, implementation of such active components on the same single substrate as the preferred embodiment single sideband mixers may be easily accomplished to thereby further synergize the integrated configuration of the preferred embodiment upconverter.

A technical advantage of the present invention is realized in providing frequency translation functions in an integrated circuit form factor. Further technical advantages are provided in the reduced size, expense, and power consumption associated with implementation in an integrated circuit form factor.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF THE INVENTION

In understanding the present invention it is helpful to understand the current state of the art with respect to upconverter solutions. Directing attention to FIG. 1, a block diagram of a typical prior art upconverter solution is shown. The upconverter circuitry of FIG. 1 is often utilized in providing up conversion of a low intermediate frequency (LIF) video signal, such as might be provided by a video signal modulated at approximately 44 MHZ in the United States or approximately 36 MHZ in Europe, to frequencies associated with particular television channels, such as may be defined in the spectrum from approximately 53 MHZ to approximately 857 MHZ.

Figure 1:
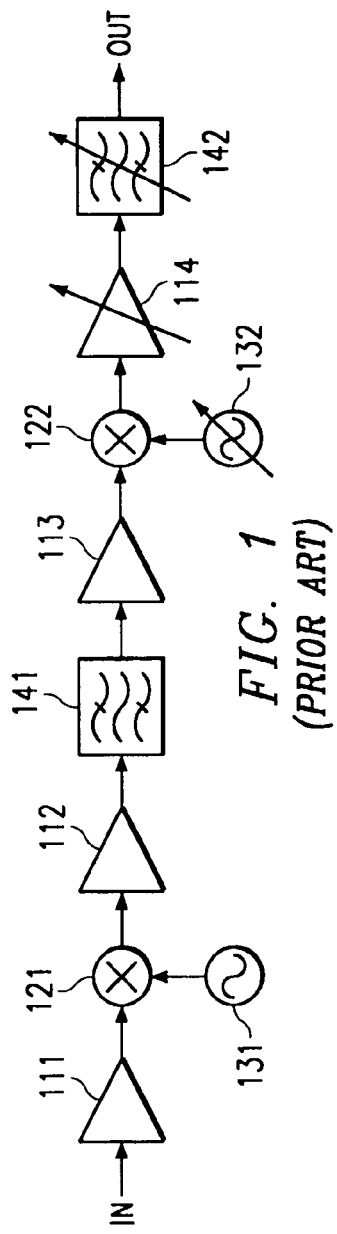
FIG. 1 shows a block diagram of a typical prior art upconverter circuit.

In the architecture of FIG. 1, amplifier 111 is provided to amplify the input signal to a desired level prior to frequency translation. Although not illustrated, according to some prior art solutions amplifier 111 may be a variable gain amplifier which is operated to maintain the input to mixer 121 at a constant magnitude.

Mixer 121 is provided to convert the input signal frequency, to a high intermediate frequency (HIF) utilizing local oscillator (LO) 131. Amplifier 112 is provided to amplify the HIF signal, such as to compensate for losses associated with mixer 121 or to otherwise amplify the HIF signal to a desired HIF output level. Because of the images and other spurious signals associated with the HIF signal as provided by mixer 121, amplifier 112 is typically a highly linear component in order to avoid distortion of the amplified signals.

Filter 141 is a bandpass filter utilized to filter the HIF signal to remove the images and other undesired spurious signals. In order to sufficiently filter the spurious signals associated with mixing the input signal with the carrier provided by LO 131, filter 141 must typically provide very sharp pass band cutoffs. Amplifier 113 is provided to amplify the filtered HIF signal, such as to compensate for filter loses, prior to final conversion to a desired frequency via mixer 122.

Mixer 122 is provided to convert the HIF signal frequency to a desired output frequency signal utilizing LO 132. In order to provide selection of a desired output channel of a frequency division set of channels, LO 132 may be a variable oscillator as shown.

Amplifier 114 is provided to amplify the selected output frequency signal to a desired output signal level. As illustrated, amplifier 114 may be a variable gain amplifier to provide selection of a desired output signal level. Because of the images and other spurious signal associated with the output signal as provided by mixer 122, amplifier 114 is typically a highly linear component in order to avoid distortion of the amplified signals. Moreover, although illustrated in FIG. 1 as a single circuit element, often amplification provided at the output stage of typical prior art upconverters is provided by a combination of one or more fixed gain amplifiers and a variable attenuator.

Filter 142 is may be a variable frequency filter utilized to suppress undesired spurious signals on either side of the desired output signal frequency. As with filter 141 discussed above, filter 142 is a bandpass filter which, in order to sufficiently filter the spurious signals associated with mixing the HIF signal with the carrier provided by LO 132, must typically provide very sharp pass band cutoffs.

Alternatively, the filtering function of filter 142 may be provided by a bank of filters where the filters of the bank filter different frequency ranges. Accordingly, depending upon the desired frequency of the output signal, a particular filter or filters may be switched in the output signal path to provide the desired filtering. However, such an embodiment adds to the size and expense of the resulting upconverter solution.

It should be appreciated that in the prior art, the above described elements are provided by discrete components in order to accommodate the desired frequency ranges and power levels, as well as to provide an output signal of a desired quality.

In order to better understand limitations of the prior art circuitry of FIG. 1, assume that the input signal is provided at a frequency of $f_{LIF}$ and that it is desired to provide an HIF signal from mixer 121 at a frequency of $f_{LO1}+f_{LIF}$. Mixer 121 will not only provide output of an HIF signal at frequency $f_{LO1}+f_{LIF}$, but will also provide an image signal at frequency $f_{LO1}-f_{LIF}$. This image signal will approximately be of the same magnitude as the desired HIF signal at frequency $f_{LO1}+f_{LIF}$. Additionally, because of the physical limitations of mixer 121 result in signal leakage, some of the carrier signal $f_{LO1}$ will also be present in the output of mixer 121. However, the carrier power level of the carrier signal $f_{LO1}$ will typically be on the order of 20 dB below the desired HIF signal level in video up conversion implementations.

In meeting video head end signal quality requirements, the power levels of the above identified spurious signals must be at least 60 dB below (-60 dBc) the power level of the desired signal. Accordingly, filter 141 must attenuate the unwanted image ($f_{LO1}-f_{LIF}$) by 60 dB or more and the leaking carrier signal ($f_{LO1}$) by 40 dB or more. If filter 141 does not provide sufficient filtering of these spurious signals they will be passed on to mixer 122 and converted, resulting in not only the original spurious signals but also additional spurious signals spawned therefrom. Accordingly, in such a situation filter 142 is not only required to provide filtering sufficient to supplement that provided by filter 141, but must also provide filtering sufficient to redress the additional spurious signals as well as the spurious signals (i.e., $f_{LO2}+f_{HIF}$ and $f_{LO2}$) associated with mixer 122. Accordingly, the filtering requirements of filter 142 may be substantial. Moreover, where the output frequency is variable, the center frequency of filter 142 must be correspondingly variable. The provision of a variable filter meeting such requirements results in added size, complexity, and cost to the upconverter solution.

Further problems are present in the prior art circuitry of FIG. 1 with respect to the amplification of the output signal. Assuming that the HIF signal is at the frequency $f_{HIF}$, mixer 122 will produce both a desired output at $f_{LO2}-f_{HIF}$ and an undesired image at frequency $f_{LO2}+f_{HIF}$, as well as a carrier leakage signal at frequency $f_{LO2}$. If $f_{LO1}$ and $f_{LO2}$ are chosen properly, the undesired image signal at frequency $f_{LO2}+f_{HIF}$ will be out of the band of interest and will not be a direct interferer. However, this undesired image signal will pose problems for amplifier 114.

As discussed above, both the desired signal at frequency $f_{LO2}-f_{HIF}$ and the undesired image at frequency $f_{LO2}+f_{HIF}$ provided by mixer 122 will be of substantially the same magnitude. Accordingly, the peak signal value in amplifier 114 will be approximately twice as large as it would be if only the desired output signal at frequency $f_{LO2}-f_{HIF}$ were provided thereto. Therefore, in order to maintain the linearity required by the system, amplifier 114 must consume much more power than would be needed if only the actual signal of interest were present and amplified. Moreover, although the above discussion is provided with reference to amplifier 114, it should be appreciated that similar problems are associated with amplifier 112. For example, the desired circuit gain may be distributed over the various amplifiers, such as amplifiers 112, 113, and 114, thereby resulting in appreciably high gain requirements and the power consumption problems discussed above with respect to amplifier 114.

Figure 2:
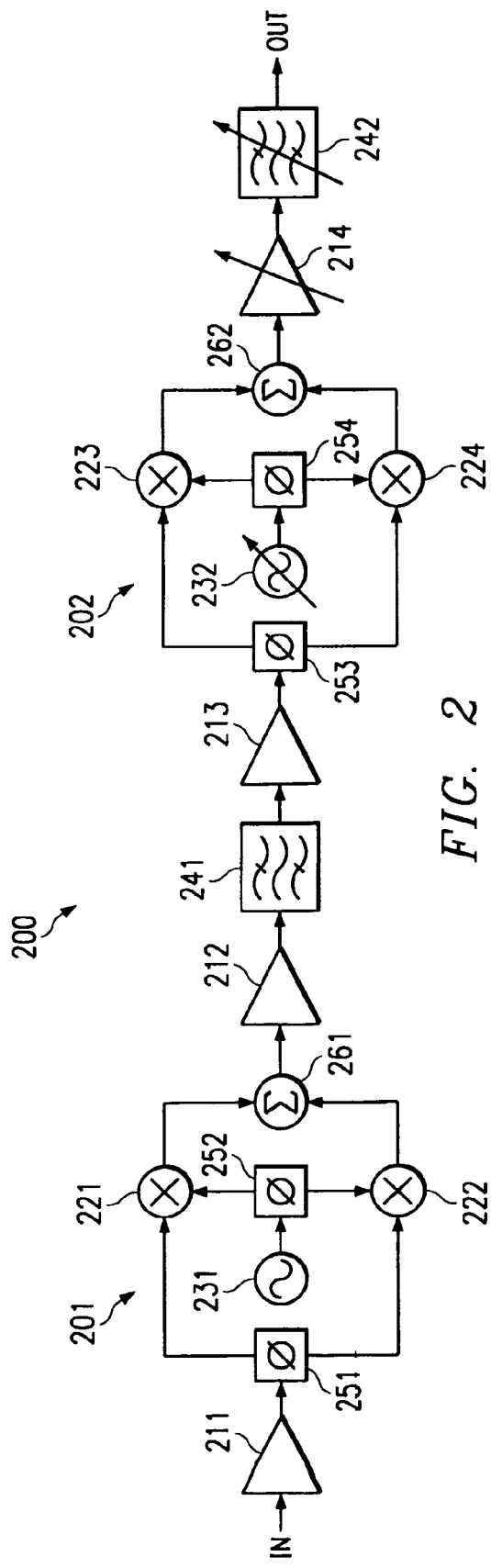
FIG. 2 shows a block diagram of a preferred embodiment frequency translation circuit.

Directing attention to FIG. 2, a preferred embodiment signal translator 200 of the present invention is shown which accommodates a relatively broad frequency range of output signals as well as provides relatively high output signal power levels. Specifically, the preferred embodiment signal translator 200 of FIG. 2 is adapted to provide frequency up conversion in a range of frequencies compatible with the spectrum of television channels typically used throughout the United States and Europe at a power level sufficient for use in television signal transmission systems such as cable television head end system. Moreover, the circuitry of the preferred embodiment is configured to utilize integrated components such that a synergistic cascade of component attributes provides an output signal having a desired signal quality, such as a signal quality meeting video transmission head end requirements.

In the preferred embodiment circuitry of FIG. 2, amplifier 211 preferably acts as an input buffer and/or provides a portion of the total system gain. Alternative embodiments of the present invention may omit amplifier 211 and/or utilize other components to provide desired signal conditioning attributes, such as a filter or attenuator element.

The signal output from amplifier 211 is provided to phase shifter 251. Phase shifter 251 provides splitting of signals provided thereto, adjusting their relative phase to thereby provide signal components having a predetermined phase relationship with respect to each other. Preferably, phase shifter 251 provides in-phase (I) and quadrature (Q) signal components (providing a 90° phase difference), although other phase relationships may be utilized according to the present invention.

Each of the signal components provided by phase shifter 251 is translated to a desired frequency through the use of an associated mixer, here mixer 221 and mixer 222. However, as LO 231 providing the carrier frequency clock utilized by both mixer 221 and mixer 222 is also provided to a phase shifter, shown as phase shifter 252, the carriers driving mixer 221 and mixer 222 are out of phase a predetermined amount, although operating at a same frequency. According to the preferred embodiment, the carrier signal components provided by phase shifter 252 are in-phase and quadrature carrier signal components, although other phase relationships may be utilized according to the present invention.

It should be appreciated that each of mixers 221 and 222 operate to provide both a desired signal and an image of the signal component provided thereto. However, the signal components provided to each of mixers 221 and 222 are out of phase a predetermined amount. Moreover, the carrier signal components provided each of mixers 221 and 222 are out of phase a predetermined amount. Accordingly, by utilizing these phase differences the signal components may be provided to mixers 221 and 222 in such a way as to result in constructive combining of desired signals and destructive combining of undesired signal images. Specifically, when the outputs of mixers 221 and 222 are summed by summer 261, the desired signal components are in-phase and constructively combine while the undesired images are out of phase and destructively combine. For example, according to the preferred embodiment of FIG. 2, assuming the input signal is at a frequency of $f_{LIF}$, the desired signal components $f_{LO1}+f_{LIF}$ from each mixers 221 and 222 are in-phase and combine to enhance the amplitude of the resulting HIF signal while the undesired signal image components $f_{LO1}-f_{LIF}$ from mixers 221 and 222 are 180° out of phase and combine to substantially null the image signals. Accordingly, as only the desired signal is output and the undesired signal images at the other sideband are suppressed, phase shifters 251 and 252, mixers 221 and 222, and summer 261 form a single sideband (SSB) or image reject mixer (SSB mixer 201).

In using an integrated circuit to implement the preferred embodiment of the present invention, double balanced mixers having very good carrier suppression can be implemented relatively easily. Accordingly, it is possible, through proper matching of components, to achieve a sideband suppression of approximately 40 dB relative to the desired signal in an integrated circuit implementation of the above described SSB mixer 201. Even with the rather high isolation between signal and spurious signals of 60 dB required in video head end application, the filtering requirements of the preferred embodiment circuitry of FIG. 2 may be relaxed. For example, assuming 40 dBc of image suppression, a filter providing an additional 20 dB of filtering may be relied upon to provide the desired level of signal quality. Such a filter may be implemented at a relatively low cost and in a relatively small footprint, such as upon the same substrate as the SSB mixer.

Referring still to FIG. 2, the output of SSB mixer 201, referred to herein as the HIF signal, is preferably provided to amplifier 212. In the preferred embodiment amplifier 212 provides a portion of the total circuit gain and/or provides the HIF signal at a desired magnitude for filtering by filter 241. Alternative embodiments of the present invention may omit amplifier 212 and/or utilize other components to provide desired signal conditioning attributes.

Filter 241 of the preferred embodiment is a bandpass filter having a center frequency corresponding to the HIF signal frequency. However, as should be appreciated from the above discussion, the particular implementation of filter 241 may provide substantially less selectivity than is typically provided in a frequency translation circuit providing similar signal qualities. This is because the preferred embodiment implementation utilizes component matching to provide a high degree of image suppression, thus negating the need for a sharp cutoff filter. Synergism is provided by the preferred embodiment configuration in that such a filter may be implemented on the same substrate as the SSB mixer of the preferred embodiment without compromising a desired level of signal quality. However, this filter may be provided externally to a common substrate utilized for a majority of the remaining circuit elements of a preferred embodiment frequency translator 200. It should be appreciated that advantages are still realized in such an alternative embodiment utilizing an external filter as the selectivity requirements of the filter remain relaxed, and thus the complexity and/or cost, of this filter is reduced. Moreover, it should also be appreciated that, where the level of image rejection provided by SSB mixer 201 provides a desired level of signal quality, filter 241 may be omitted, if desired.

In the preferred embodiment of FIG. 2, amplifier 213 is provided at the second frequency translation stage to act as an input buffer and/or provides a portion of the total system gain. Alternative embodiments of the present invention may omit amplifier 213 and/or utilize other components to provide desired signal conditioning attributes.

According to the preferred embodiment, a second SSB mixer, SSB mixer 202 comprising phase shifters 253 and 254, mixers 223 and 224, and summer 262, is provided to down convert the HIF signal to a desired output frequency, such as may correspond to a desired television frequency division channel. Accordingly, similar to SSB mixer 201 discussed above, the signal output from amplifier 213 is provided to phase shifter 253. Phase shifter 253 provides splitting of signals provided thereto, adjusting their relative phase to thereby provide signal components having a predetermined phase relationship with respect to each other. Preferably, phase shifter 253 provides I and Q signal components, although other phase relationships may be utilized according to the present invention.

Each of the signal components provided by phase shifter 253 is translated to a desired frequency through the use of an associated mixer, here mixer 223 and mixer 224. However, as LO 232 providing the carrier frequency clock utilized by both mixer 223 and mixer 224 is also provided to a phase shifter, shown as phase shifter 254, the carriers driving mixer 223 and mixer 224 are out of phase a predetermined amount, although operating at a same frequency. According to the preferred embodiment, the carrier signal components provided by phase shifter 254 are in-phase and quadrature carrier signal components, although other phase relationships may be utilized according to the present invention.

As described in detail above with respect to SSB mixer 201, SSB mixer 202 utilizes the phase differences the signal components to result in constructive signal and destructive signal image combining at summer 262. Accordingly, SSB mixer 202 is used to reduce the magnitude of the undesired image at frequency $f_{LO2}+f_{HIF}$, assuming frequency $f_{HIF}$ is the frequency of the desired signal at the high intermediate frequency, while enhancing the desired signal at frequency $f_{LO2}-f_{HIF}$.

It should be appreciated that LO 232 is illustrated as a variable oscillator, such as may be implemented in the form of a voltage controlled oscillator. Accordingly, SSB mixer 202 may be controlled to translate an input signal at fHIF to any of a plurality of output signal frequencies, such as may correspond to particular defined channel frequencies. Additionally or alternatively, LO 232 may be controlled so as to provide a frequency hopping scheme suitable for deterring useful interception of a transmitted signal and/or for use in multiplexing a signal or plurality of signals, such as in time division bursts, on various output frequencies.

Amplifier 214 is provided to manipulate the amplitude of the signal provided from SSB mixer 202. Preferably amplifier 214 is utilized to provide the final amount of circuit gain to the signal output by frequency translator 200. Although illustrated as a single circuit element, amplifier 214 may be implemented as a combination of various gain stages. It should be appreciated that amplifier 214 is shown as a variable gain amplifier, such as may be useful in providing an output signal at a controllable magnitude. However, fixed gain amplifiers may be utilized according to the present invention. Additionally, where no gain adjustment is desired, amplifier 214 may be omitted, if desired.

It should be appreciated that the SSB mixers of the preferred embodiment of the present invention substantially reduce or eliminate the image signals associated with translation of the signal. Accordingly, rather than being provided two signals as in the prior art circuitry of FIG. 1, amplifier 214 is substantially provided only the desired signal. Accordingly, as there is only one signal provided to amplifier 214, the linearity requirements of this amplifier are substantially relaxed. For example, when multiple signals at different frequencies are present they can intermodulate, with each other and create unwanted spurious signals so the linearity becomes very crucial. However, by reducing the amplitude of the unwanted image, output amplifier of the present invention does not have that intermodulation, thus significantly relaxing the linearity requirements and thereby making implementation of the amplifier easier. Moreover, the presence of substantially a single signal results in less power being consumed in signal amplification by amplifier 214. Accordingly, such an amplifier may be implemented on a same substrate as all or substantially all of the circuit elements of frequency translator 200 shown in FIG. 2.

The preferred embodiment of FIG. 2 includes filter 242 in the output signal path. According to this preferred embodiment the filter is an adjustable frequency filter that may be adjusted to a particular center frequency corresponding to adjustment of LO 232. Accordingly, filter 242 may be utilized for additional filtering of spurious signals if desired. However, because the mixers utilized by the preferred embodiment of the present invention provide a high level of sideband signal rejection, filter 242 may be implemented with a lesser degree of selectivity than that of prior art upconverter solutions. Moreover, alternative embodiments of the present invention may omit filter 242, if desired.

It should be appreciated that the preferred embodiment frequency translator 200 provides a first SSB mixer stage up converting an input signal to a HIF which is preferably at a frequency above the entire range of selectable output frequencies. Accordingly, the second SSB mixer stage provides down conversion of the HIF to a particular desired frequency of the range of selectable output frequencies. By proper selection of the carrier frequency provided by LO 231 ($f_{LO1}$) and of the carrier frequency provided by LO 232 ($f_{LO2}$), images associated with SSB mixer 201 and/or SSB mixer 202 may be provided out of band and, therefore, their undesired effects further mitigated according to the present invention.

Operation of the present invention is not limited to use in upconverting a modulated signal, such as the above described modulated video signal. For example, the present invention may be utilized to provide frequency translation of a signal provided thereto in baseband I and Q. Accordingly, an alternative embodiment of the present invention may omit phase shifter 251 in favor of utilizing a baseband I and Q signal at mixers 221 and 222 respectively.

It should be appreciated that the frequency translation circuitry of the present invention may be utilized in a number of systems. For example, the signal quality of the above described preferred embodiment is suitable for use in cable television head end and/or video on demand type services.

Moreover, because of the reduced size, complexity, cost, and/or power requirements of the preferred embodiment frequency translator utilizing substantial circuit integration of the circuit elements, i.e., an upconverter on a "chip", embodiments of the present invention are uniquely adapted for deployment in configurations heretofore not possible. For example, frequency translators of the present invention may be deployed at neighborhood nodes of a cable television system to facilitate delivery of pay per view video or video on demand to select subscribers in the neighborhood. Additionally or alternatively, the ability to distribute frequency translation functionality throughout a communication system, such as the aforementioned cable television system, allows new and improved services to be offered. For example, highly directive communications, such as neighborhood advertisements, may be inserted on particular channels in particular areas.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A video bandwidth signal frequency converter system comprising:
   an input signal interface accepting a video bandwidth signal at a first frequency;
   an output signal interface passing said video bandwidth signal at a desired frequency;
   a first single sideband mixer coupled to said input signal interface and said output signal interface, wherein said single sideband mixer translates said video bandwidth signal from said first frequency to a different frequency; and
   a second single sideband mixer coupled to said input signal interface and said output signal interface, wherein said first single sideband mixer is disposed between said input signal interface and said second single sideband mixer, and wherein said second single sideband mixer translates said video bandwidth signal from said different frequency to said desired frequency;
   wherein said first single sideband mixer comprises:
      a first mixer accepting a first input signal component of said input signal provided to said first single sideband mixer and providing a first mixed signal and a first image signal;
      a second mixer accepting a second input signal component of said input signal provided to said first single sideband mixer and providing a second mixed signal and a second image signal; and
      a combiner accepting said first mixed signal, said first image signal, said second mixed signal, and said second image signal, wherein said first mixed signal and said second mixed signal are substantially constructively combined by said combiner and said first image signal and said second image signal are substantially destructively combined by said combiner.

2. The system of claim 1, wherein said different frequency is a higher frequency than both said first frequency and said desired frequency.

3. The system of claim 1, wherein each of said first single sideband mixer and said second single sideband mixer are disposed in a single integrated circuit substrate.

4. The system of claim 1, wherein said second single sideband mixer comprises:
   a third mixer accepting a first input signal component of said input signal provided to said second single sideband mixer and providing a third mixed signal and a third image signal;
   a fourth mixer accepting a second input signal component of said input signal provided to said second single sideband mixer and providing a fourth mixed signal and a fourth image signal; and
   a combiner accepting said third mixed signal, said third image signal, said fourth mixed signal, and said fourth image signal, wherein said third mixed signal and said fourth mixed signal are substantially constructively combined by said combiner and said third image signal and said third image signal are substantially destructively combined by said combiner.

5. The system of claim 1, further comprising:
   a signal amplitude manipulator coupled to said second single sideband mixer accepting said video bandwidth signal at said desired frequency, wherein each of said first single sideband mixer, said second single sideband mixer, and said signal amplitude manipulator are disposed in a single integrated circuit substrate.

6. The system of claim 5, wherein said signal amplitude manipulator provides signal amplitude amplification.

7. The system of claim 5, wherein said signal amplitude manipulator provides signal amplitude attenuation.

8. The system of claim 1, further comprising:
a filter coupled to said first single sideband mixer accepting said video bandwidth signal at said different frequency and providing attenuation of image signals approximating a difference between system image rejection requirements and image rejection achieved by said first single sideband mixer.

9. The system of claim 1, further comprising:
a filter coupled to said first single sideband mixer accepting said video bandwidth signal at said different frequency and providing attenuation of carrier leakage signals approximating a difference between system carrier leakage rejection requirements and carrier leakage rejection achieved by said first single sideband mixer.

10. The system of claim 8, wherein each of said first single sideband mixer and said filter are disposed in a single integrated circuit substrate.

11. The system of claim 8, wherein said first single sideband mixer is disposed in a single integrated circuit substrate and said filter is disposed external thereto.

12. An integrated circuit frequency translation system comprising:
a first single sideband mixer circuit having a first input and a first output, wherein a signal provided to said first input is provided to said first output at an increased frequency; and
a second single sideband mixer circuit having a second input and a second output, wherein said second single sideband mixer is coupled to said first single sideband mixer, and wherein a signal provided to said second input is provided to said second output at a decreased frequency, and wherein said first single sideband mixer and said second single sideband mixer are disposed in a common integrated circuit substrate;
wherein said first single sideband mixer comprises:
a first mixer accepting a first input signal component of said input signal provided to said first single sideband mixer and providing a first mixed signal and a first image signal;
a second mixer accepting a second input signal component of said input signal provided to said first single sideband mixer and providing a second mixed signal and a second image signal; and
a combiner accepting said first mixed signal, said first image signal, said second mixed signal, and said second image signal, wherein said first mixed signal and said second mixed signal are substantially constructively combined by said combiner and said first image signal and said second image signal are substantially destructively combined by said combiner.

13. The system of claim 12, wherein said second single sideband mixer comprises:
a third mixer accepting a first input signal component of said input signal provided to said second single sideband mixer and providing a third mixed signal and a third image signal;
a fourth mixer accepting a second input signal component of said input signal provided to said second single sideband mixer and providing a fourth mixed signal and a fourth image signal; and
a combiner accepting said third mixed signal, said third image signal, said fourth mixed signal, and said fourth image signal, wherein said third mixed signal and said fourth mixed signal are substantially constructively combined by said combiner and said third image signal and said third image signal are substantially destructively combined by said combiner.

14. The system of claim 12, wherein said first single sideband mixer comprises:
a phase shifter at said first input to split a signal provided thereto and to provide a predetermined phase differential between each split signal.

15. The system of claim 14, wherein said split signals are provided in an in-phase and quadrature relationship with each other.

16. The system of claim 12, wherein said first input comprises an in-phase input and a quadrature input.

17. The system of claim 12, further comprising:
an amplifier coupled to a signal path associated with said first input, wherein said amplifier is also disposed in said common integrated circuit substrate.

18. The system of claim 12, further comprising:
an amplifier coupled in a signal path between said first single sideband mixer circuit and said second single sideband mixer circuit wherein said amplifier is also disposed in said common integrated circuit substrate.

19. The system of claim 18, wherein said amplifier provides linear operation substantially only at said increased frequency.

20. The system of claim 12, further comprising:
an amplifier coupled to a signal pat associated with said second output, wherein said amplifier is also disposed in said common integrated circuit substrate.

21. The system of claim 12, further comprising:
a filter coupled in a signal path between said first single sideband mixer circuit and said second single sideband mixer circuit, wherein said filter provides attenuation approximately equal to a difference between system requirements and an amount of image rejection provided by said first single sideband mixer.

22. The system of claim 21, wherein said filter is also disposed in said common integrated circuit substrate.

23. The system of claim 12, wherein said first single sideband mixer comprises a substantially fixed frequency carrier and said second single sideband mixer comprises a variable frequency carrier.

24. The system of claim 23, wherein said increased frequency is a frequency above a desired range of video signal frequency division channels and wherein said decreased frequency is a particular video signal frequency division channel of said range of video signal frequency division channels.

25. The system of claim 12, wherein said system is disposed in a television signal transmission head end circuit.

26. The system of claim 12, wherein said system is disposed in a television cable system neighborhood node.

* * * * *

UNITED STATES PATENT AND TRADEMARK OFFICE
CERTIFICATE OF CORRECTION

| | | |
|---|---|---|
| PATENT NO. | : 7,403,761 B2 | Page 1 of 1 |
| APPLICATION NO. | : 11/523785 | |
| DATED | : July 22, 2008 | |
| INVENTOR(S) | : Kirk B. Ashby et al. | |

It is certified that error appears in the above-identified patent and that said Letters Patent is hereby corrected as shown below:

In Column 12, Claim 20, line number 35, delete that portion of text "pat" and replace with --path--.

Signed and Sealed this

Sixteenth Day of September, 2008

JON W. DUDAS
*Director of the United States Patent and Trademark Office*